United States Patent [19]

O'Neill

[11] Patent Number: 5,621,614

[45] Date of Patent: Apr. 15, 1997

[54] APPARATUS FOR MOUNTING AND ENCLOSING AN APPLIANCE

[75] Inventor: Edward L. O'Neill, San Leandro, Calif.

[73] Assignee: Lucasey Manufacturing Company, Oakland, Calif.

[21] Appl. No.: 519,055

[22] Filed: Aug. 24, 1995

[51] Int. Cl.$^6$ ..................................................... H05K 7/20
[52] U.S. Cl. .................. 361/698; 62/3.3; 165/104.33; 257/713; 257/930; 361/696
[58] Field of Search .................................. 361/689, 690, 361/695, 696, 697, 698–701, 704, 707, 717–719, 776, 789; 363/141; 62/259.2, 418, 3.3, 3.6, 3.62, 3.7, 324.3; 165/80.3, 80.4, 104.33, 122, 126, 185; 174/15.2, 16.3; 136/203–205; 257/712, 713, 714, 715, 721, 722, 930

[56] References Cited

U.S. PATENT DOCUMENTS

| | | | |
|---|---|---|---|
| 4,407,133 | 10/1983 | Edmonson | 62/3 |
| 5,269,146 | 12/1993 | Kerner | 62/3.62 |
| 5,271,455 | 12/1993 | Semple | 165/80.4 |
| 5,319,937 | 6/1994 | Fritsch | 62/3.62 |
| 5,320,162 | 6/1994 | Seaman | 165/2 |
| 5,367,879 | 11/1994 | Doke | 62/3.6 |
| 5,505,046 | 4/1996 | Nelson | 62/3.6 |

*Primary Examiner*—Gerald P. Tolin
*Attorney, Agent, or Firm*—Niro, Scavone, Haller & Niro

[57] ABSTRACT

The apparatus of the present invention comprises a housing defining a closed interior volume of a size sufficient to accommodate the appliance, a first heat sink located within the housing, a second heat sink located outside the housing, a reversible heat pump disposed between and in heat conductive engagement with each of the first and second heat sinks, a temperature sensor located within the housing, and electronic circuitry to actuate the heat pump in either of a first cooling mode or a second heating mode in response to predetermined temperature set points sensed by the temperature sensor within the housing. The apparatus also includes an appliance support tray and a holding bracket that engages and maintains the tray in spaced relation within the housing. A pressure equalizing diaphragm is also employed to accommodate pressure changes within the housing.

8 Claims, 6 Drawing Sheets

APPARATUS FOR MOUNTING AND ENCLOSING AN APPLIANCE

BACKGROUND OF THE INVENTION

The present invention relates to environmentally controlled enclosures and, more particularly, to enclosures for maintaining electrically-powered appliances in an environment well suited to their long-term operation. The present invention finds particularly advantageous application for mounting, housing and protecting video monitors and TVs from otherwise hostile ambient conditions.

In recent years, video monitors have become one of the primary information transmission appliances in society. Their use has extended from air, bus and rail terminals to shopping malls and retail sales establishments, and even to a variety of outdoor sports and recreational venues. However, conventional video display equipment includes components that are sensitive to adverse weather conditions and other environmental contaminants. For example, present day video monitors do not perform well when exposed to extremely hot or cold temperatures for prolonged periods. Likewise, rain, high humidity and salt mists can cause malfunction. Even dust, dirt and insects can interfere with a monitor's proper operation. As a result, use of video monitors in many outdoor venues have been curtailed, or have proven costly due to increased maintenance and shortened service life.

A need, therefore, exists for an enclosure that will suitably mount, house and protect environmentally sensitive appliances, particularly modern video display equipment, in a simple and cost effective manner.

SUMMARY OF THE INVENTION

The present invention is, therefore, directed to an apparatus for mounting and enclosing an environmentally-sensitive appliance. In one embodiment, the apparatus of the present invention comprises a housing defining a closed interior volume of a size sufficient to accommodate the appliance, a first heat sink located within the housing, a second heat sink located outside the housing, a reversible heat pump disposed between and in heat conductive engagement with each of the first and second heat sinks, a temperature sensor located within the housing, and electronic circuitry to actuate the heat pump in either of a first cooling mode or a second heating mode in response to predetermined temperature set points sensed by the temperature sensor within the housing.

In accordance with another embodiment of the invention, the apparatus comprises an appliance support tray, a housing defining a closed interior volume of a size sufficient to accommodate both the tray and the appliance resting on the tray, a holding bracket configured to position the tray and appliance within the housing and spaced from the housing walls, the holding bracket also having a load bearing member to support the appliance, tray and housing. Additionally, this second embodiment also includes the first and second heat sinks, the reversible heat pump, the temperature sensor, and electronic circuitry to actuate the heat pump in either of a first cooling mode or second heating mode.

In a third embodiment of the invention, the structures comprising either of the first two above-noted embodiments are incorporated together with a pressure sensitive diaphragm that helps to preserve the housing in a substantially sealed condition to minimize the ingress of ambient contaminants into the interior volume of the housing.

In accordance with a further embodiment of the invention, a signal receptor is mounted externally of the housing and is connected to one end of a signal transmitting line which communicates with the appliance contained within the housing, thereby permitting remote access or control of the appliance.

BRIEF DESCRIPTION OF THE DRAWINGS

The novel features which are characteristic of the present invention are set forth in the appended claims. The invention itself, however, together with further objects and attendant advantages, will be best understood by reference to the following description taken in connection with the accompanying drawings in which:

DETAILED DESCRIPTION OF THE PREFERRED EMBODIMENTS

Figure 1:
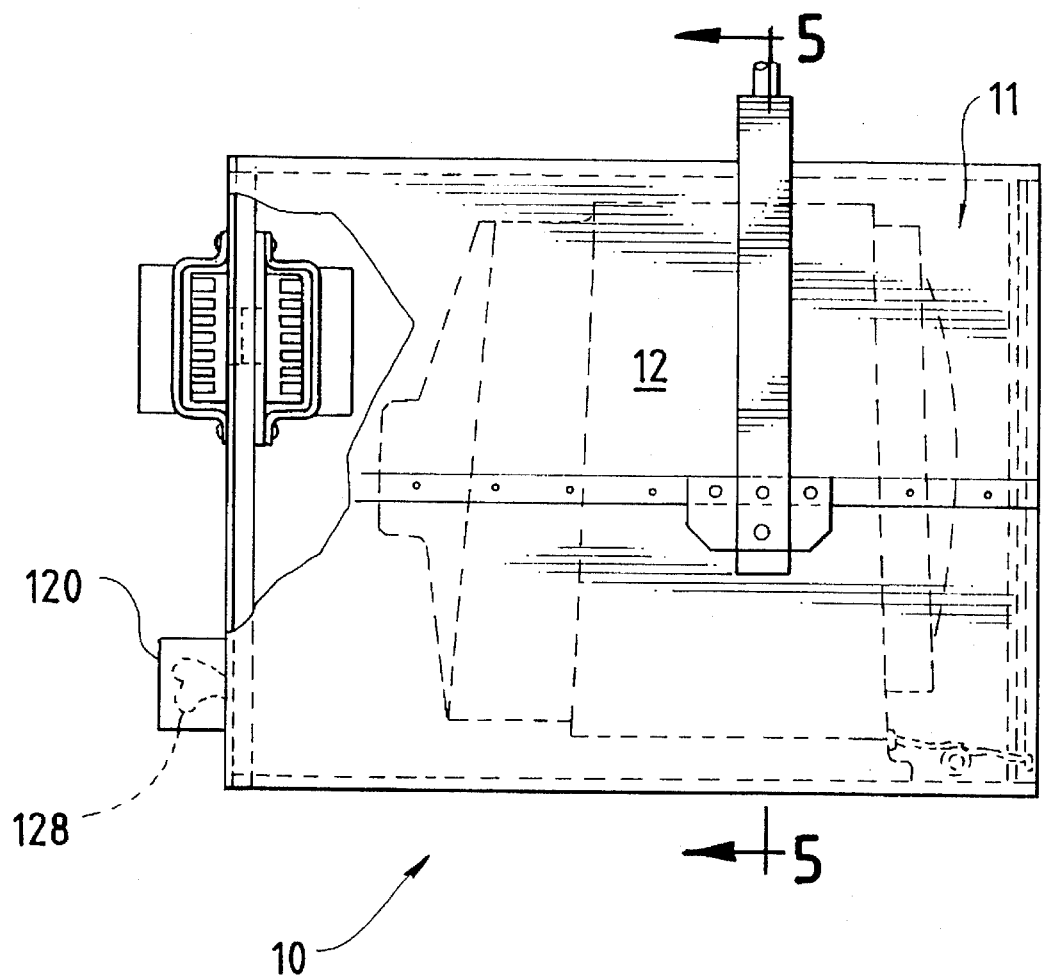
FIG. 1 is a side elevation, in partial cross-section, showing the general arrangement of a video display monitor housed within an enclosure constructed in accordance with a preferred embodiment of the invention.
Figure 2:
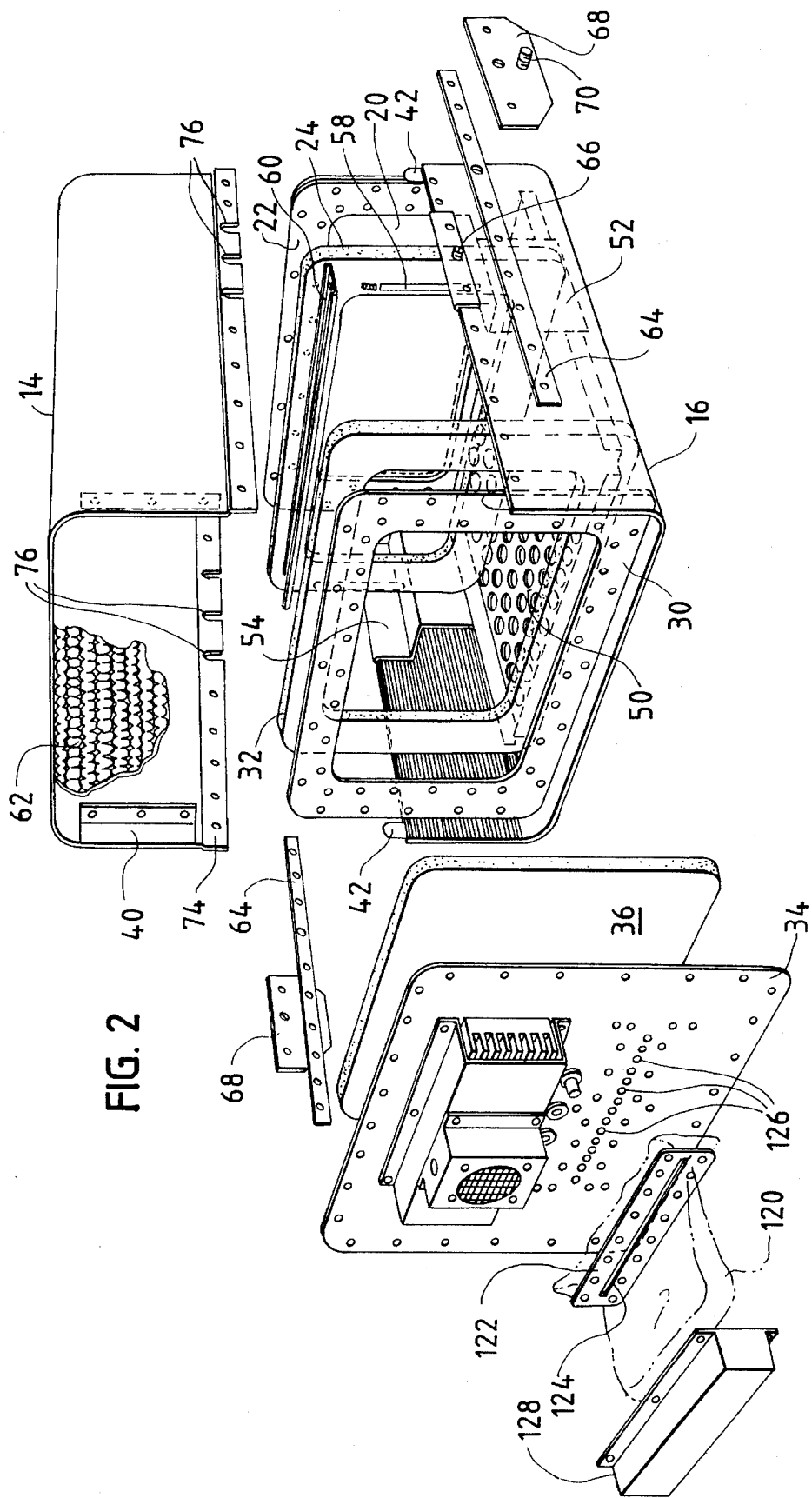
FIG. 2 is an exploded perspective view of the enclosure illustrated in FIG. 1.

With particular reference to FIGS. 1 and 2, a preferred appliance mounting and enclosure apparatus embodying the present invention is designated generally as 10 and shown having a TV or video display monitor 12 disposed within it. While the invention will be hereafter described with respect to a video monitor 12, the invention is not so limited, and may find useful application with other environmentally sensitive appliances.

The apparatus 10 includes a housing 11 comprised of upper casing 14 and lower casing 16 which, together with front and back panel assemblies, form an interior volume having a size sufficient to accommodate the monitor 12. The front panel assembly comprises a lexan panel 20 mounted to bezel 22. A front foam insulation frame 24 is disposed behind bezel 22 to minimize heat transfer from the interior of the housing through the front panel assembly. The back panel assembly likewise includes a back frame 30 also provided with a foam insulation frame 32, once again to minimize heat transfer. The back panel assembly also includes a mounting panel 34 and a substantially co-extensive insulation panel 36.

The bezel 22 and back frame 30 are welded or otherwise permanently affixed to lower casing 16 and each includes vertically-extending slots or recesses (not shown) which act as locating tracks for vertically-extending positioning brackets 40 disposed on the inner side walls of upper casing 14. Lower casing 16 also includes a plurality of upwardly-extending locating tabs 42 which cooperate with upper casing 14 to insure proper orientation of the upper and lower casings in the finally-assembled housing.

Disposed within the housing 11 is an appliance-supporting tray 50 which is carried or supported on each side by a Z-shaped bracket 52. In turn, brackets 52 have upper vertically-extending segments 54 which are welded or otherwise affixed to the interior sidewalls of lower casing 16. Alternatively, the upper segment 54 of each Z-bracket 52 may comprise an inverted U-shaped flange which receives the upper edge of its associated lower casing side wall. The particular form of the bracket is not critical to the present invention, and those skilled in the art will appreciate that a variety of different bracket configurations may be employed. It is, however, important that the brackets be so configured so as to position the tray 50 together with the appliance 12 resting on the tray such that the appliance is disposed in spaced relation to the side walls of the housing. This again tends to minimize the potential for heat transfer between the housing and the appliance. It also serves to more efficiently maintain a proper operating temperature within the housing in accordance with the present invention.

Figure 5:
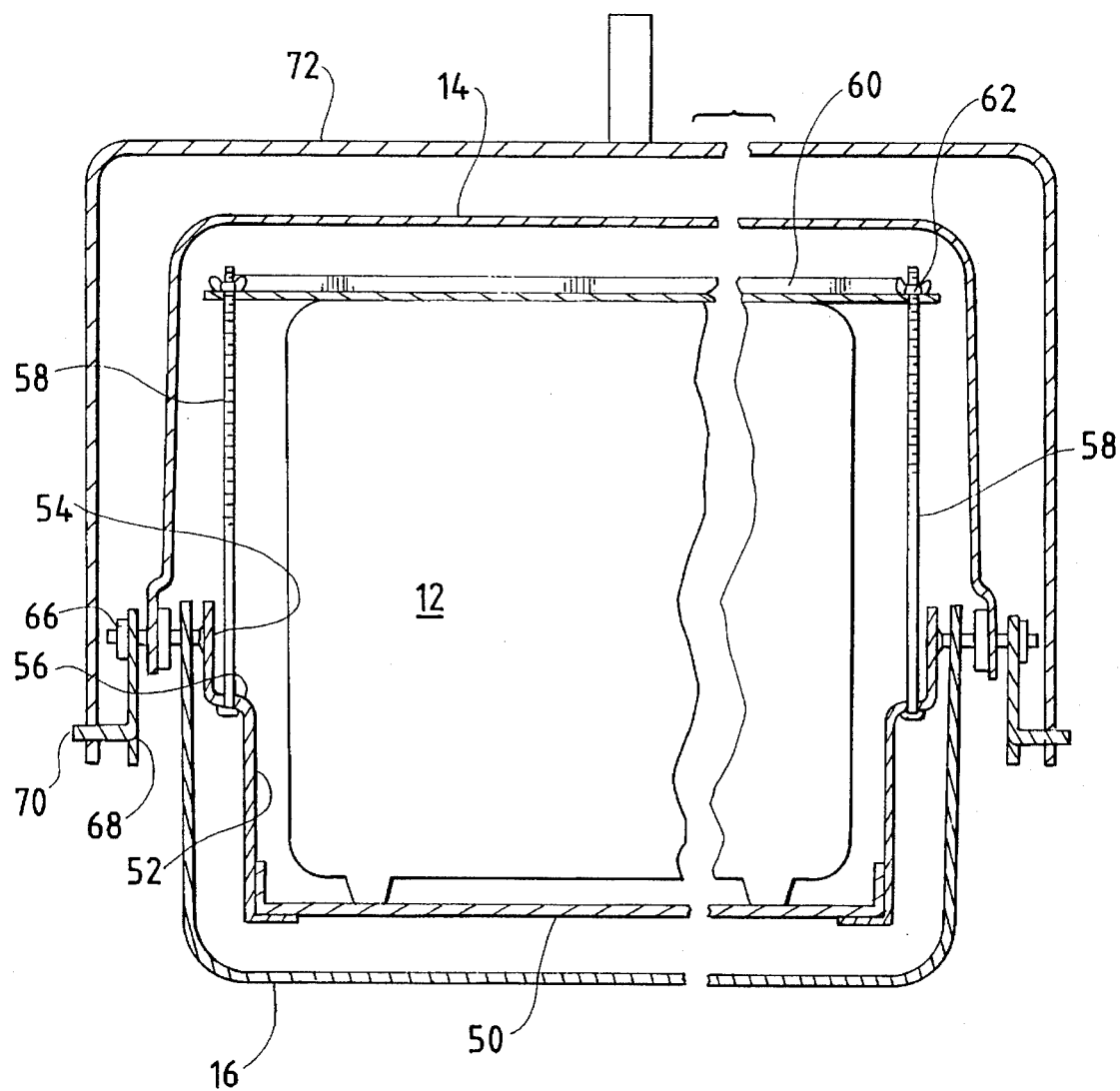
FIG. 5 is a cross-sectional view illustrating the arrangement of the enclosure of FIG. 1 with a suitable mounting structure.

As illustrated in more detail in FIG. 5, Z-bracket 52 includes a horizontal mid-portion 56 which includes threaded apertures for receipt of upstanding threaded rods 58. These threaded rods, positioned on opposite sides of the appliance 12, receive a security yoke 60 which is held in firm engagement against the top of the appliance by wing nuts 62. In this way, the entire mounting and enclosing apparatus 10 may be tilted or oriented at angles relative to horizontal without disrupting or moving the appliance mounted within.

Each of the Z-brackets 52 includes one or more load-bearing members such as studs 66 which extend through and connect to mounting bracket 68. Thus, the mounting brackets 68 are positioned on opposing sides of the housing 11 and include laterally-extending support studs 70 which cooperates with a ceiling hanger 72, or other mounting structure. Upper housing 14 has lower sidewall flanges 74 which telescope over the upper edges of the lower casing sidewalls, with the silicone strips 64 sandwiched in between. Slots 76 in flanges 74 accommodate the studs 66 to insure proper alignment and assembly. In accordance with the invention, therefore, the housing 11 and the appliance 12 are each independently supported by the load bearing member, studs 66.

In order to further enhance the insulative qualities of the housing 11, a suitable reflective bubble insulation 62 may be employed on the interior surfaces of both upper casing 14 and lower casing 16. Moreover, in order to minimize the ingress or egress of air to and from the interior volume of the housing, silicone sealing strips 64 are utilized at the juncture of the upper and lower casings. Likewise, a suitable silicone sealant or caulking material (not shown) may be applied around the external juncture of the bezel 22 and mounting panel 34, where each adjoins the upper and lower casings.

Figure 3:
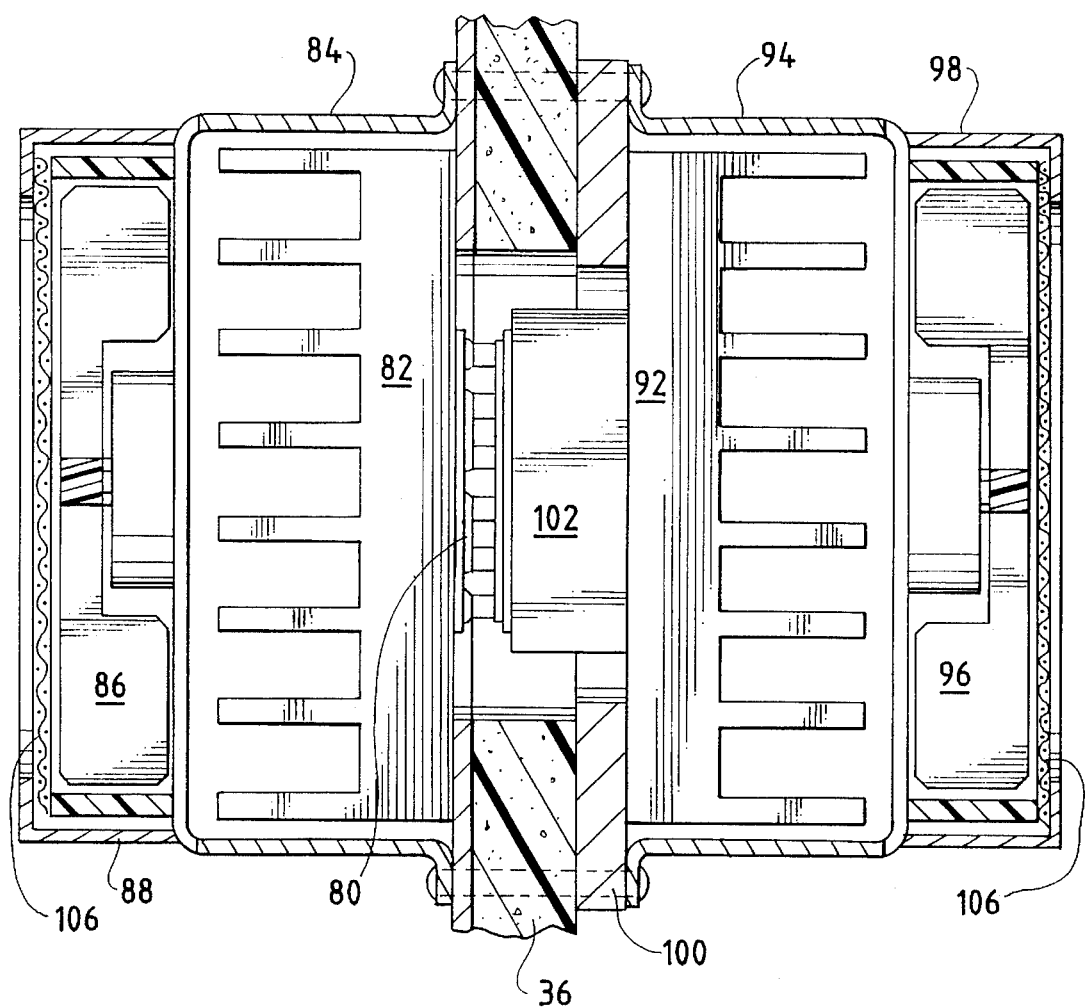
FIG. 3 is an enlarged cross-sectional view of the heat transfer components of the embodiment illustrated in FIG. 1.
Figure 4:
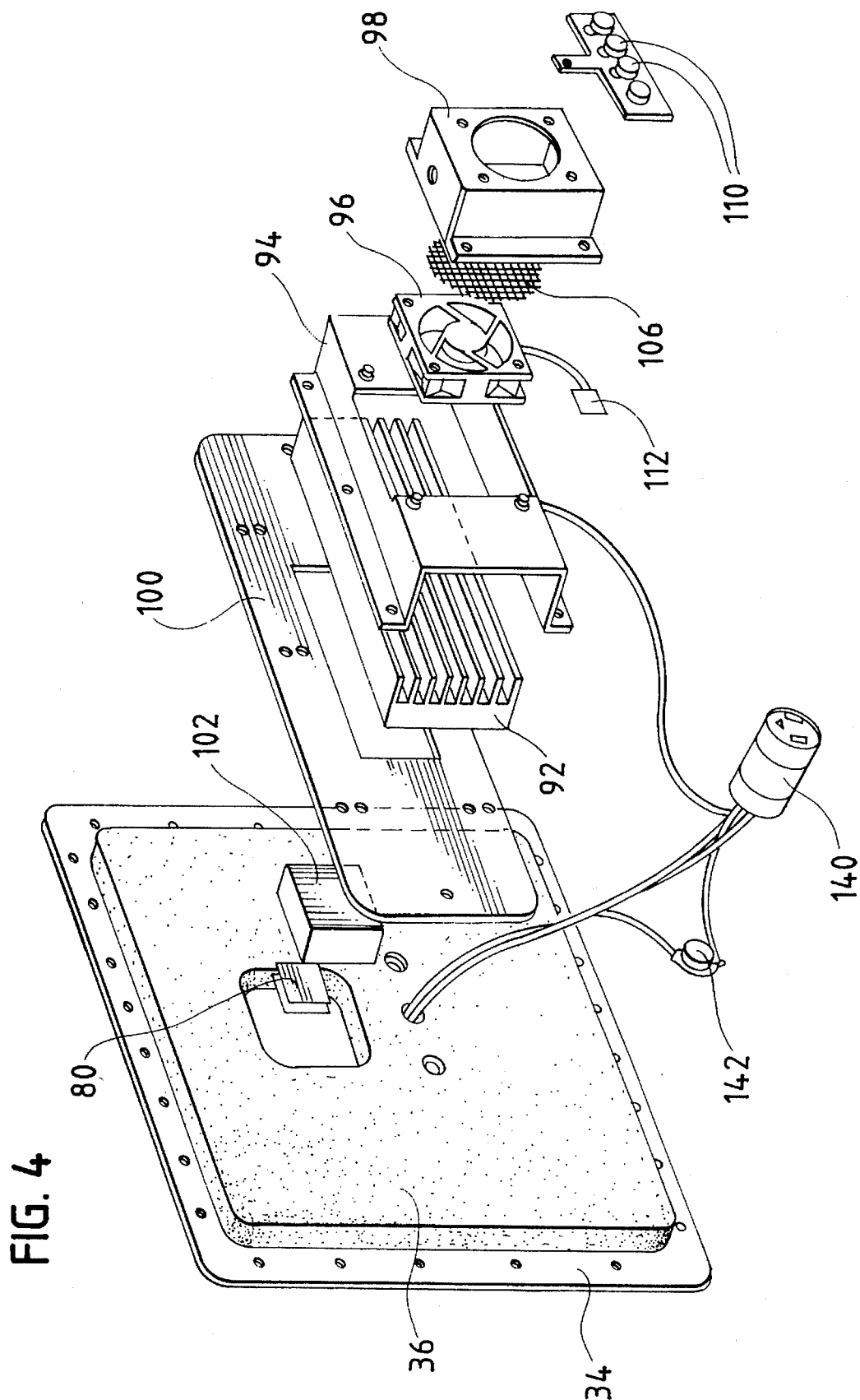
FIG. 4 is another exploded perspective view illustrating certain heat transfer components and wiring for the enclosure illustrated in FIG. 1.

With reference now to FIGS. 3 and 4, the details of the heat transfer assembly of the present invention are illustrated. Both mounting panel 34 and insulation panel 36 includes a generally central opening to accommodate the heat transfer assembly. Heat transfer is accomplished by means of a DC-powered reversible heat pump 80, preferably a thermoelectric temperature modulator such as part number CP1-4-127-045L manufactured by Melcor, 1040 Spruce Street, Trenton, N.J. 08648. Positioned externally of the housing is an outside heat transfer sub-assembly comprising an extruded aluminum heat sink 82 in direct heat conductive contact with the outside of heat pump 80. The outside heat sink 82 is enclosed by cover 84 which in turn supports a brushless fan 86 enclosed and protected by fan shell 88. Likewise, on the inside of the housing, a mere image inside heat transfer sub-assembly is disposed including inside heat sink 92, heat sink cover 94, brushless fan 96, and fan shell 98. The interior heat transfer sub-assembly is supported on mounting plate 100. An appropriate heat conductive spacer 102 is utilized to provide a continuous conductive heat transfer path from the interior surface of heat pump 80 to the facing surface of inside heat sink 92, thereby accommodating the space occupied by the foam insulation panel 36 and mounting plate 100.

Suitable brushless fans are well known to those ordinary skill in the art. For example, 12-V DC brushless fans manufactured under part No. 273-243B by Radio Shack Corporation can be used to advantage. It is also desirable to provide a fine wire mesh screen 106 for each of the fans to protect the internal components from any possible damaging foreign object.

In accordance with the present invention, one or more temperature sensors are employed and disposed within the housing to maintain the temperature internal to the housing 11 within a pre-selected operating range. To that end, temperature sensors 110 may be conveniently mounted to the interior fan shell 98. These temperature sensors 110 are selected to provide appropriate electronic switching of the DC circuitry that is utilized to power both the heat pump 80 and the fans 86 and 96. When the apparatus of the present invention is employed with a video display monitor 12, the desired operating range is above 32° F. and below 100° F. To that end, a variety of well known DC switching temperature sensors may be employed. For example, suitable sensors are manufactured under part Nos. CA-85 and SSO-35 by Selco Corporation, 7580 Stage Road, Buena Park, Calif. 90621, having 85° F. and 35° F. set points.

In operation, DC power is supplied to the interior of the housing and connected in parallel to both the heat pump 80 and the fans 86 and 96. The temperature sensors 110 are likewise disposed in the DC circuit such that when the temperature within the housing exceeds 85° F., a first set of sensors are switched causing the heat pump 80 to cool on its interior surface and heat on its exterior surface. Simultaneously, each of the fans 86 and 96 are actuated to provide an air flow over outside heat sink 82 and inside heat sink 92, respectively. In this manner, sensible heat is transferred from the air within the housing to heat sink 92 and is then passed by conductive heat transfer through spacer 102, the heat pump 80 and into outside heat sink 82. Finally, of course, the heat is transferred from the outside heat sink 82 to the external environment. On the other hand, if the temperature within the housing drops below the 35° F. set point, a second set of temperature sensors 110 are switched on to reverse the DC current in the circuitry thereby reversing the operation of heat pump 80 so that it cools on its exterior surface and heats on its interior surface. As a result, heat is transferred from the external environment to the interior volume of the housing. In either case, the brushless fans are actuated through a silicone bridge rectifier 112 to operate in the same air flow direction regardless of the polarity of voltage in the circuit. A suitable silicone bridge rectifier for use in accordance with the present invention is manufactured by Radio Shack Corporation under manufacturing part No. 276-1161.

It will be appreciated by those of skill in the art that in accordance with the present invention, the electronic circuitry is configured to receive a first signal from the internal temperature sensors when the temperature within the housing volume exceeds a first set point and to thereby actuate the heat pump in response to this first signal to transfer heat from the interior of the housing to the outside environment. Likewise, the electronic circuitry is configured to receive a second signal from the temperature sensor when the temperature within the volume falls below a second set point and to thereby actuate the heat pump in response to the second signal to transfer heat from the external environment to the interior of the volume. Moreover, this is accomplished without any need for the transfer of a heating medium from outside the housing to its interior or from the interior of the housing to the external environment. Instead, the air or gas present within the housing is maintained without any contamination from the external environment.

In accordance with another preferred embodiment of the present invention, changes in barometric pressure or changes in the internal air pressure of the housing arising from temperature changes therein are accommodated. To that end, a pressure diaphragm 120 is mounted on the rear mounting panel 34 (or other wall of housing 11) using a retainer plate 122. The retainer plate includes a central opening 124 which is positioned coincident with one or more apertures 126 in mounting panel 34. Preferably, the diaphragm 120 takes the form of a very light and extremely flexible plastic bag constructed from any one of variety of well known thermoplastics, such as polyethylene or polypropylene. The bag is protected by diaphragm cover 128 which has appropriate openings to allow expansion or contraction of the diaphragm 120 in response to increases or decreases in air pressure within the housing. It will be appreciated by those of skill in the art that the use of this inexpensive and simple pressure equalizing diaphragm permits the utilization of simple and inexpensive seals around the various housing joints. There is no need for expensive O-rings or specially configured gaskets and precisely dimensioned sealing components. Nonetheless, even modest and inexpensive seals such as silicone caulking can be used with little risk of failure. In this way, the opportunity for incidental introduction of even minute amounts of water or moisture into the housing is minimized. This is important when the apparatus of the present invention is employed as a housing for a video monitor, due to the fact that even a small additional amount of moisture within the housing can create a fogging or hazing on the lexan viewing panel 20 that will impede the visibility of the monitor.

Figure 6:
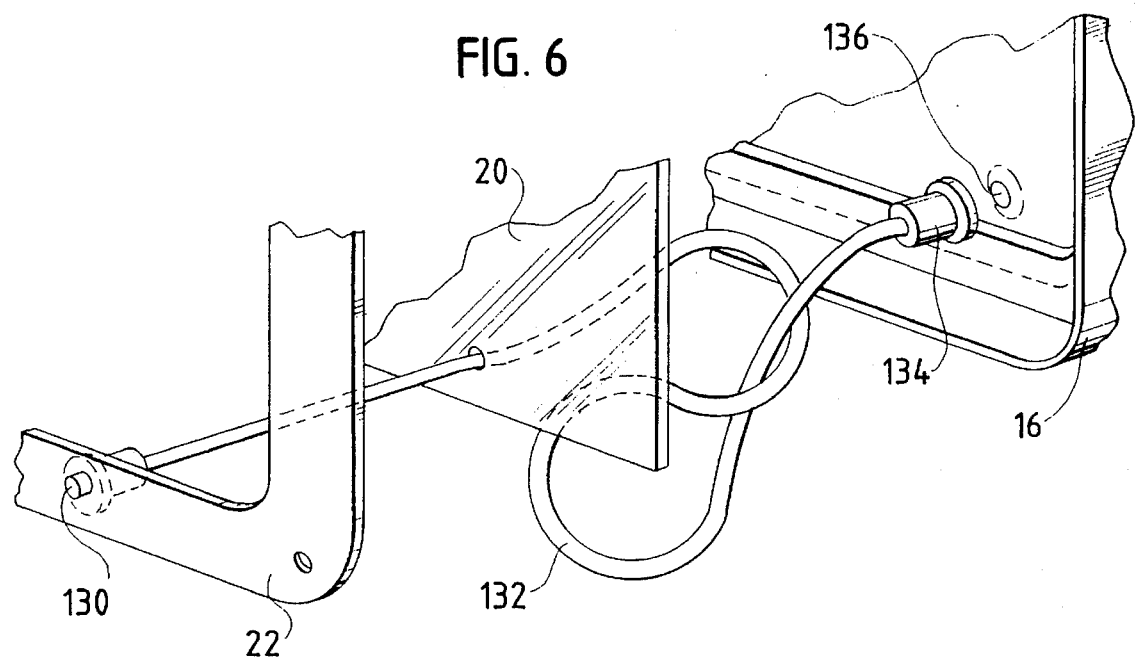
FIG. 6 is also an exploded perspective view, showing further details of the enclosure of FIG. 1 to provide remote access to the housed appliance.
Figure 7:
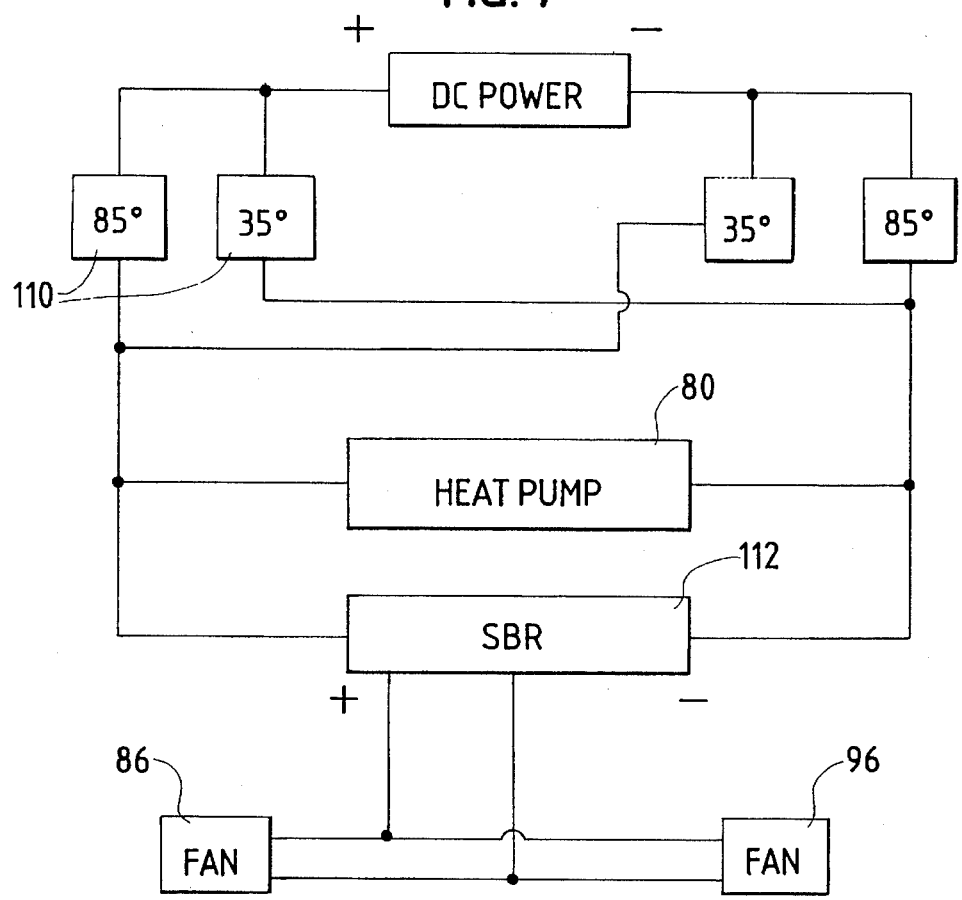
FIG. 7 is a simple electronic circuit suitable for use in the enclosure apparatus of the present invention.

With particular reference now to FIG. 6, the mounting and enclosing apparatus of the present invention can also be provided with structure to permit remote access and control of the appliance housed within the apparatus. To that end, a suitable signal receptor 130 can be mounted in the bezel 22 or any other external surface of the housing 11. The receptor, in turn, is connected to a signal transmission line 132, such as a fiber optic cable, which extends to a fiber optic button or other signal transmitting connection 134 mounted in juxtaposition to the appliance signal receptor 136. Alternatively, the fiber optic signal transmission line 132 may extend through and out of the housing and may terminate in a receptor 130 which is mounted at some point remote from the housing and within range of a complementary remote control device. In either embodiment, the appliance mounted and enclosed within the apparatus can be controlled and operated by conventional remote control devices utilized by an operator positioned at some distance remote from the enclosure.

The appliance is provided with AC power via a AC power connector 140 which may also include in the AC circuitry an overload temperature sensor 142. Thus, if the heat transfer assembly of the present invention is inoperative for any reason, and the temperature within the interior of the housing rises to a level which may pose danger to the continued operation of the appliance, the overload temperature sensor 142 disconnects the AC power to the appliance. Other suitable connectors for necessary RF signals, AC and DC power or other transmission signals may be located in mounting panel 34.

It will be appreciated by those skilled in the art that various changes and modifications can be made to the illustrated embodiments without departing from the spirit of the present invention. All such modifications and changes are intended to be covered by the appended claims.

What is claimed is:

1. An apparatus for maintaining an operational environment for an environmentally and temperature sensitive appliance, comprising:

a housing defining a closed interior volume of a size sufficient to accommodate said appliance;

a first heat sink located within said housing;

a second heat sink located outside said housing;

a reversible heat pump disposed between and in heat conductive engagement with each of said first and second heat sinks;

a temperature sensor located within said housing;

electronic circuitry configured to (i) receive a first signal from said temperature sensor when the temperature within said volume exceeds a first set point and actuate said heat pump in response to said first signal to transfer heat from said first heat sink to said second heat sink, and (ii) receive a second signal from said temperature sensor when the temperature within said volume falls below a second set point and actuate said heat pump in response to said second signal to transfer heat from said second heat sink to said first heat sink; and a pressure sensitive diaphragm disposed in a wall of said housing and responsive to changes in the pressure within said housing to accommodate expansion or contraction of the gas volume within said housing to thereby minimize gas flow into or out of said housing.

2. The apparatus of claim 1 further comprising a first fan for circulating air within said housing over said first heat sink and a second fan for circulating external ambient air over said second heat sink.

3. The apparatus of claim 1 further comprising an appliance support tray disposed within said housing and a holding bracket for maintaining the support tray in spaced relation from the housing.

4. The apparatus of claim 1 further comprising first and second fans, each of said fans being mounted with one of said first and second heat sinks and operable to direct a flow of air toward and over said heat sinks.

5. The apparatus of claim 4 wherein each of said first and second heat sinks includes outwardly extending fins and said air flow is directed toward a center point of said heat sinks and passes therefrom to opposing ends of said fins.

6. An apparatus for maintaining an operational environment for an environmentally and temperature sensitive appliance, comprising:

a housing defining a closed interior volume of a size sufficient to accommodate said appliance;

a first heat sink located within said housing;

a second heat sink located outside said housing;

a reversible heat pump disposed between and in heat conductive engagement with each of said first and second heat sinks;

a temperature sensor located within said housing;

a DC power source to operate said heat pump;

at least two thermostatically-controlled switches, at least one of said switches being closed only when the temperature within said housing exceeds a first set point to actuate said heat pump and to transfer heat from said first heat sink to said second heat sink, and at least one other of said switches being closed only when the temperature within said housing falls below a second set point to actuate said heat pump and to transfer heat from said second heat sink to said first heat sink; and a pressure sensitive diaphragm disposed in a wall of said housing and responsive to changes in the pressure within said housing to accommodate expansion or contraction of the gas volume within said housing to thereby minimize gas flow into or out of said housing.

7. An apparatus for mounting and enclosing an appliance, comprising:

an appliance support tray;

a holding bracket engaging the tray and having a load bearing member;

a housing defining a closed interior volume of a size sufficient to accommodate in spaced relation said tray and the appliance resting on said tray, said housing also engaging and being carried by the load bearing member;

a first heat sink located within said housing;

a second heat sink located outside said housing;

a reversible heat pump disposed between and in heat conductive engagement with each of said first and second heat sinks;

a temperature sensor located within said housing;

a DC power source no operate said heat pump;

at least two thermostatically-controlled switches, at least one of said switches being closed only when the temperature within said housing exceeds a first set point to actuate said heat pump and to transfer heat from said first heat sink to said second heat sink, and at least one other of said switches being closed only when the temperature within said housing falls below a second set point to actuate said heat pump and to transfer heat from said second heat sink to said first heat sink.

8. The apparatus of claim 7 further comprising a pressure sensitive diaphragm disposed in a wall of said housing and responsive to changes in the pressure within said housing to accommodate expansion or contraction of the gas volume within said housing to thereby minimize gas flow into or out of said housing.

* * * * *